(12) United States Patent
Bell et al.

(10) Patent No.: US 10,410,696 B2
(45) Date of Patent: Sep. 10, 2019

(54) METHODS AND APPARATUSES FOR COMMAND SHIFTER REDUCTION

(71) Applicant: Micron Technology, Inc., Boise, ID (US)

(72) Inventors: Debra Bell, Dallas, TX (US); Kallol Mazumder, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/857,597

(22) Filed: Dec. 28, 2017

(65) Prior Publication Data

US 2018/0122439 A1 May 3, 2018

Related U.S. Application Data

(63) Continuation of application No. 14/693,769, filed on Apr. 22, 2015, now Pat. No. 9,892,770.

(51) Int. Cl.
| | |
|---|---|
| *G11C 7/10* | (2006.01) |
| *G11C 7/22* | (2006.01) |
| *G06F 9/30* | (2018.01) |

(52) U.S. Cl.
CPC ............ *G11C 7/22* (2013.01); *G06F 9/30156* (2013.01); *G11C 7/109* (2013.01); *G11C 2207/2272* (2013.01)

(58) Field of Classification Search
CPC ........ G11C 7/22; G11C 7/109; G06F 9/30156
See application file for complete search history.

(56) References Cited

U.S. PATENT DOCUMENTS

| | | | |
|---|---|---|---|
| 5,028,922 A | 7/1991 | Huang | |
| 6,178,130 B1 | 1/2001 | Tsern et al. | |
| 9,892,770 B2 | 2/2018 | Bell et al. | |
| 2003/0061536 A1 | 3/2003 | Nakai et al. | |
| 2003/0081470 A1 | 5/2003 | Kho et al. | |
| 2005/0162957 A1 | 7/2005 | Oh | |
| 2005/0254337 A1 | 11/2005 | Lee et al. | |
| 2006/0250861 A1 | 11/2006 | Park et al. | |
| 2009/0248969 A1 | 10/2009 | Wu et al. | |

(Continued)

FOREIGN PATENT DOCUMENTS

| | | |
|---|---|---|
| KR | 1020080052047 | 6/2008 |
| WO | 20160171974 A1 | 10/2016 |

OTHER PUBLICATIONS

International Search Report and Written Opinion received for PCT/US2016/027283 dated Jul. 20, 2016; pp. all.

(Continued)

*Primary Examiner* — Uyen B Tran
(74) *Attorney, Agent, or Firm* — Dorsey & Whitney LLP

(57) ABSTRACT

Apparatuses and methods for reducing a number of command shifters are disclosed. An example apparatus includes an encoder circuit, a latency shifter circuit, and a decoder circuit. The encoder circuit may be configured to encode commands, wherein the commands are encoded based on their command type and the latency shifter circuit, coupled to the encoder circuit, may be configured to provide a latency to the encoded commands. The decoder circuit, coupled to the latency shifter circuit, may be configured to decode the encoded commands and provide decoded commands to perform memory operations associated with the command types of the decoded commands.

10 Claims, 5 Drawing Sheets

(56) References Cited

U.S. PATENT DOCUMENTS

| | | | |
|---|---|---|---|
| 2012/0254873 A1 | 10/2012 | Bringiviayaraghavan | |
| 2012/0266008 A1* | 10/2012 | Coteus .................... | G06F 1/10 |
| | | | 713/400 |
| 2013/0250701 A1 | 9/2013 | Bringivijayaraghavan et al. | |
| 2014/0355361 A1 | 12/2014 | Bell et al. | |
| 2015/0268862 A1* | 9/2015 | Ware ....................... | G11C 8/12 |
| | | | 711/5 |
| 2016/0314823 A1 | 10/2016 | Bell et al. | |

OTHER PUBLICATIONS

Extended European Search Report received for EP Application No. 16783616.2 dated Oct. 17, 2018, pp. all.

Notice of Preliminary Rejection for KR application No. 10-2017-7024233 dated Jan. 15, 2019; pp. all.

U.S. Appl. No. 16/416,425 titled "Methods and Apparatuses For Command Shifter Reduction" filed May 20, 2019, pp. all.

* cited by examiner

METHODS AND APPARATUSES FOR COMMAND SHIFTER REDUCTION

CROSS-REFERENCE TO RELATED APPLICATION

This application is a continuation of U.S. patent application Ser.No. 14/693,769 filed Apr. 22, 2015 and issued as U.S. Pat. No. 9.892.770 on Feb. 13, 2018. The aforementioned application, and issued patent, is incorporated herein by reference, in its entirety, for any purpose.

BACKGROUND

Semiconductor memories conventionally receive memory commands from a memory controller. The memory commands may be a combination of signals, such as a chip select (CS), a write enable (WE), a column address strobe (CAS), and a row address strobe (RAS), to name a few. The combination of command signals may be received by a command decoder, which may generate internal commands based thereon. The command decoder, depending on the command type, read or write for example, may provide the corresponding internal signals to different or varied circuits internal to the memory so the commands are performed as required. Because the memories perform different commands, duplicate circuitry may be used to distinguish between command types within the memories. The duplicate circuitry may partially be required because the internal command signals may be similar. A path on which the commands propagate in the memories may be used to distinguish between command types. However, segments of the paths may be redundant and only included to distinguish the command types.

For example, memories have conventionally included separate command shifters for each command type. One command shifter may be used for reads and a separate command shifter may be used for writes. Including multiple command shifters, however, may consume large areas of semiconductor die and increase power consumption. The command shifters may further consume die area and power when their size is increased to accommodate longer expected latencies, for example. Command shifters may be included in a memory to provide desired operational latencies, such as CAS latency, CAS write latency, CAS additive latency, etc., necessary for proper operation of the memory. The separate command shifters for each command type, such as additive latency shifters and master-slave CAS write latency shifters, were needed because there could be an overlap in read and write commands and further because the physical signals used to represent the commands may be similar. As such, to ensure the commands were interpreted correctly, the separate shifters were used to assist in distinguishing command type. This redundant use of die area and power consumption may then unnecessarily impose size and power consumption penalties on memories. Therefore, there is a desire to reduce the number of shifters included in memory in order to reduce die size and power consumption.

DETAILED DESCRIPTION

Figure 1:
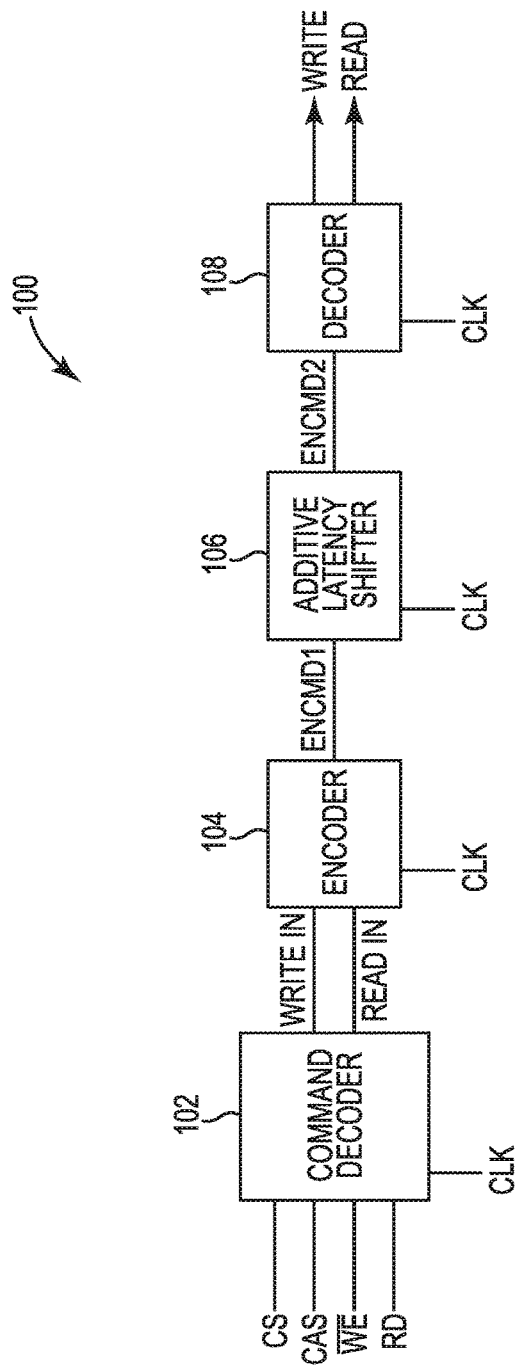
FIG. 1 is a block diagram of an example apparatus that includes command path in accordance with the present disclosure.

Apparatuses and methods for reducing the number of command shifters included in a memory are disclosed herein. The number of command shifters included in a memory may be reduced through the encoding of commands provided to a command shifter and the subsequent decoding of the commands provided by the command shifter. Encoding the commands may allow fewer command shifters provide commands of different types instead of using dedicated command shifters for each command type. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

As discussed above, conventional memories may include a command shifter for different types of commands the memory is capable of performing, such as read commands and write commands. Further, the number of command shifters may also depend on the number and type of memory commands the memory may perform, such as master-slave commands and conventional commands. Whereas a conventional command may only need at least two command shifters, one for read commands and one for write commands, master-slave commands may need at least four command shifters, one for master read, one for slave read, one for master write, and one for slave write. As such, there may be a number of redundant command shifters included in memories.

The command shifters may provide timing information regarding the performance of the commands by virtue of the latency the command shifters impart to the propagation of the commands from a command decoder to the circuitry intended to perform the commands. For memories that include short latencies, a number of redundant command shifters may not be an issue in terms of die area consumption and power consumption. A short latency in this regard may be around five clock cycles, e.g., 5tCK. If, however, latencies increase to times of around 30tCK, then the command shifters may consume much larger amounts of die area and power. This may be due to the conventional design of the command shifters, which include a variable number flip flops through which the commands propagate to provide the latency, e.g., the delay, required with longer latencies using more flip flops.

Moreover, in conventional memories the internal commands that are provided by the command decoder may be represented by similar signals. For example, the commands may be represented by a signal that is at a high (or low) logic level for the duration of a clock cycle 1tCK, e.g., a 1tCK pulse. A pulse of 1tCK is provided by way of example and should not be taken as a limiting aspect of embodiments of the invention. Because the various internal commands are similarly represented, the separate command shifters, which may be part of a command path for respective commands, may allow the different commands to be distinguished. Moreover, different commands may also be propagating through their respective command shifters nearly simultaneously even though they may be separated by a minimum number of clock cycles, four clock cycles for example. Thus, the separate and multiple command shifters are included in conventional memories to assist with distinguishing command types and to allow co-pendency of multiple commands.

The inclusion of redundant command shifters, however, may be negated through the encoding of the different command types. By encoding the commands, the multiple, redundant command shifters may be reduced to fewer command shifters, one for example. The reduction of command shifters may partially be based on the minimum number of clock cycles separating the commands. This minimum number of clock cycles may also determine the encoding scheme and hence the number of commands capable of being encoded. Each intervening clock cycle between leading edges of the commands may be used to encode the commands. For example, the intervening clock cycles, or a derivative of that number, between the leading edges of the commands may be used to extend the pulse width of the commands to encode the commands. To illustrate, a write command represented by a 1tCK signal pulse may be transformed to a pulse with a width of 2 clock cycles, where the 2tCK pulse represents the encoded write command. As such, different command types may be transformed from a conventional signal of 1tCK in width to a signal of a longer pulse width based on command type. Alternatively, each intervening clock cycle may be used to encode a binary value to distinguish between commands. For example, a write command of 1tCK pulse may be encoded to a 2tCK pulse, which, in this embodiment, may be viewed as a binary value of "11," or "110," with each encoded "1" represented by a 1tCK clock pulse.

The number of command shifters may be reduced through encoding of the internal commands (and subsequent decoding once they have propagated through the command shifter), which may result in a reduced consumption of die area and power.

FIG. 1 is a block diagram of an apparatus that includes a command path 100 according to an embodiment of the present disclosure. The apparatus may be a computer, laptop computer, a portable electronic device, and the like. The command path 100, which may at least include a command decoder 102, an encoder circuit 104, an additive latency shifter circuit (ALS) 106, and a decoder circuit 108, may be included in a memory, such as a non-volatile memory or a volatile memory. Examples of non-volatile memory may include NAND and NOR flash memories, and examples of volatile memory may include dynamic random access memory (DRAM), random access memory (RAM), and their variations. Additional elements of the command path are not shown for the sake of brevity, but those of skill in the art would understand the various components of the command path and their operation.

The command path 100 may be configured to provide multiple command types, e.g., read and write commands, via the ALS 106 based on encoding and decoding the commands upon entry and exit of the ALS 106. This technique may be in contrast to the conventional configuration, which may require a command shifter for each command type. The command path 100 may be configured to provide an internal command, a read command for example, from an input to various circuitry for use during operation. The command path 100 has a command path delay. That is, the command path 100 takes a finite time, as known, to propagate a command from the input to the circuitry using the command. The signal provided to the various circuitry may be used, for example, to enable operation of the circuitry.

The command decoder 102 may be configured to receive the various command signals and provide an internal command signal to the encoder 104. The encoder 104 encodes the command signal, as will be described in more detail below, and outputs the encoded command ENCMD1 signal responsive to the CLK signal. That is, the encoder 104 outputs encoded command ENCMD1 signals to the ALS 106 responsive to the CLK signal. The ALS 106 may be configured to shift the encoded command ENCMD1 signal through it responsive to the CLK signal. The shifting adds clock cycles tCK of the CLK signal (by virtue of the CLK) to provide additive latency to the propagation of the encoded command ENCMD1 signal through the command path 100. As known, latency may be added to accommodate the timing of internal operations of the memory and may be programmed or set by a user or manufacture, for example, by an additive latency value (typically in terms of the number of tCKs). The ALS 106 may provide the encoded internal commands to the decoder 106, which may decode the encoded commands back into their original command type. The decoded commands may then be provided to their corresponding circuitry for operation.

The command decoder 102 may be configured to receive memory commands from an external component, a memory controller or a system on a chip for example. The externally provided memory commands may be decoded into internal commands, e.g., the internal commands may be generated based on the externally provided commands, which may then be provided to corresponding memory circuits for their performance. For example, a write command, which may be a combination of the CS, CAS, and /WE signals, may be received by the command decoder 102. The command decoder 102 may then decode the combination of the command signals to provide internal command signals along the command path 100, for example. Other parts of the internal commands, such as memory address information, may be provided via a different path to a memory array. The commands, e.g., write and read commands, may be provided via the command path 100, and may first be provided to the encoder 104. As used herein, the term "command," and its plural, may mean "internal command(s)." Reference to external commands may be explicitly stated.

The encoder 104 may receive the internal commands from the command decoder 102 and may be configured to encode the commands based on command type. The encoding may be based on command type and a clock cycle width of a system clock CLK, e.g., tCK. For example, a write command may be encoded from a high logic level of one clock cycle wide, e.g., a clock pulse of 1tCK, to a high logic level of two clock cycles wide, e.g., a clock pulse of 2tCK. A read command, on the other hand, may be encoded from a pulse of 1tCK to a pulse of 1tCK. Further, a minimum number of clock cycles that separate commands may also influence the encoding and how many types of commands may be encoded. For example, if leading edges of the commands are separated by four clock cycles, then the number of command types that may be encoded may be based on the number of intervening clock cycles between commands. The number of available clock cycles may be the minimum number of clock cycles less one clock cycle. Thus, for the present example of a four clock cycle minimum number of clock cycles, there would be three available clock cycles for encoding commands.

In some embodiments, a command type may be represented by the width in clock cycles of the pulse representing the encoded command, which may be one, two, or three clock cycles, and which may lead to the encoding of at least three possible commands if the encoding, and subsequent decoding, is based on the width in tCK of the encoded signal. In some embodiments, the commands may be encoded in a binary manner and the three available clock cycles may be used to encode up to eight commands, e.g., the three-digit binary representations for 0 through 7, preceded by a rising edge, e.g., a "1." For example, commands may be encoded by the encoder 104 as "110," "100," "101," "000," "001," "010," "011," and "111." Each of the eight possibilities, however, may be preceded by a high logic level, e.g., a "1," at their leading edge, which may allow the decoder to distinguish between received commands. As such, the encoded command signals may be, for example, "1XXX," where the "XXX" represents the encoded command. The encoder 104 may then provide the encoded commands to the ALS 106.

The ALS 106 may be an additive latency shifter and may also provide command timing based on the amount of latency the ALS 106 is configured to provide. The ALS 106 may include a plurality of series-coupled flip flops. The latency of the ALS 106 may be adjusted based on a number of internal flip flops, for example, through which a signal propagates. The number of flip flops included in the ALS 106 may dictate an area of a semiconductor die consumed. For example, the greater the latency the ALS 106 may accommodate, the greater the number of flip flops included and the larger the area consumed. For additive latency shifters that are designed to accommodate small amounts of latency, e.g., five clock cycles, a number of duplicate shifters, e.g., one for each command type, included on a die may not be significant. On the other hand, however, as latencies increase, e.g., 30 or more clock cycles, the area of a die consumed for a single shifter may be significant. A technique, as discussed herein, to use a single additive latency shifter that may provide a large latency value for multiple commands may be desired to at least reduce die area, and possibly reduce power consumption. Such an ALS 106 may be used for a master-slave read shifter, a master-slave write shifter, a read additive latency shifter, and/or a write additive latency shifter. Further, as noted, a single ALS 106 may be used to replace multiple redundant latency shifters of any of the aforementioned types of shifter.

The decoder 108 may be configured to receive the encoded commands ENCMD2 from the ALS 106 and further configured to decode the encoded commands ENCMD2. The decoded commands, e.g., read and write commands, may then be provided by the decoder 108 to their intended circuits of the memory. The encoded commands ENCMD2 may be decoded by the decoder 108 based on the pulse width of the signal representing the encoded command ENCMD2. Alternatively, if the commands are binary encoded, then the decoder 108 may decode the encoded commands based on the binary sequence received. The decoded commands may then be provided on separate outputs to a memory array (not shown), for their operation.

In operation, the command decoder 102 may receive a number of command signals, such as the CS, CAS and one or both of the /WE and RAS signals. Each combination of command signals may be decoded into a command type such as write commands and read commands. Further, commands may be received with a minimum number of CLK cycles between them, which is maintained within the command path 100. The minimum number of CLK cycles may be from leading edge to leading edge and may, for example, be four clock cycles of the CLK signal. Based on the combination of signals, the command decoder 102 may generate and provide an internal command, which may be provided to the encoder 104.

The encoder 104 may encode the commands based on the command type. The commands may be encoded by altering a pulse width of the signal representing the command, e.g., a number of clock cycles the command is at a high (or low) logic level. The intervening clock cycles between the leading edge of the commands, e.g., the available clock cycles, may be used for encoding the commands. For example, a write command may be encoded to be at a high logic level for two clock cycles while a read command may be encoded to be at a high logic level for one clock cycle. Alternatively, the available clock cycles may be used to encode binary information, such as one clock cycle for each bit of a three bit code. Thus, a three bit binary code may be used to encode up to eight commands using three clock cycles. The encoded commands may be provided to the ALS 106.

The ALS 106 may shift the commands based on the CLK signal and an amount of latency provided by the ALS 106 may be adjusted based on the number of latches or flip flops the commands propagate through within the ALS 106. Also, the latency of the ALS 106 provides timing information to the memory, which may be used to determine when to provide data to input/out (IO) pads or latch data on the IO pads. The encoded commands ENCMD2 may be provided to the decoder 108 by the ALS 106.

The decoder 108 may be configured to decode the commands based on their respective encoding. For example, an encoded command is received that is at a high logic level for two adjacent clock cycles, then the encoded command may be decoded as a write command and provided on a corresponding output. An encoded command that is at a high logic level for one clock cycles may be decoded as a read command and also provided on a corresponding output. For embodiments that implement the alternative encoding, e.g., representing a binary bit by each available clock cycle, the decoder may decode accordingly. The alternative encoding may be used to encode more than two commands and may be used with master-slave (MS) commands. Accordingly, the various read and write permutations associated with MS commands may be provided by the command path 100. For example, an encoded command of "111" may represent a non-MS write, an encoded "100" may represent a non-MS read, and so on. One skilled in the art would understand the various commands and encoding possibilities, which are all contemplated by the present disclosure.

Thus, by encoding commands, fewer command shifters may be used in a memory to provide internal memory commands from a memory decoder to their respective operational circuitry. Such a result may allow for the reduction in the number of redundant command shifters a memory may incorporate onto their design/die. Accordingly, less die area may be used for memories due to the reduction in command shifters included therein.

Figure 2:
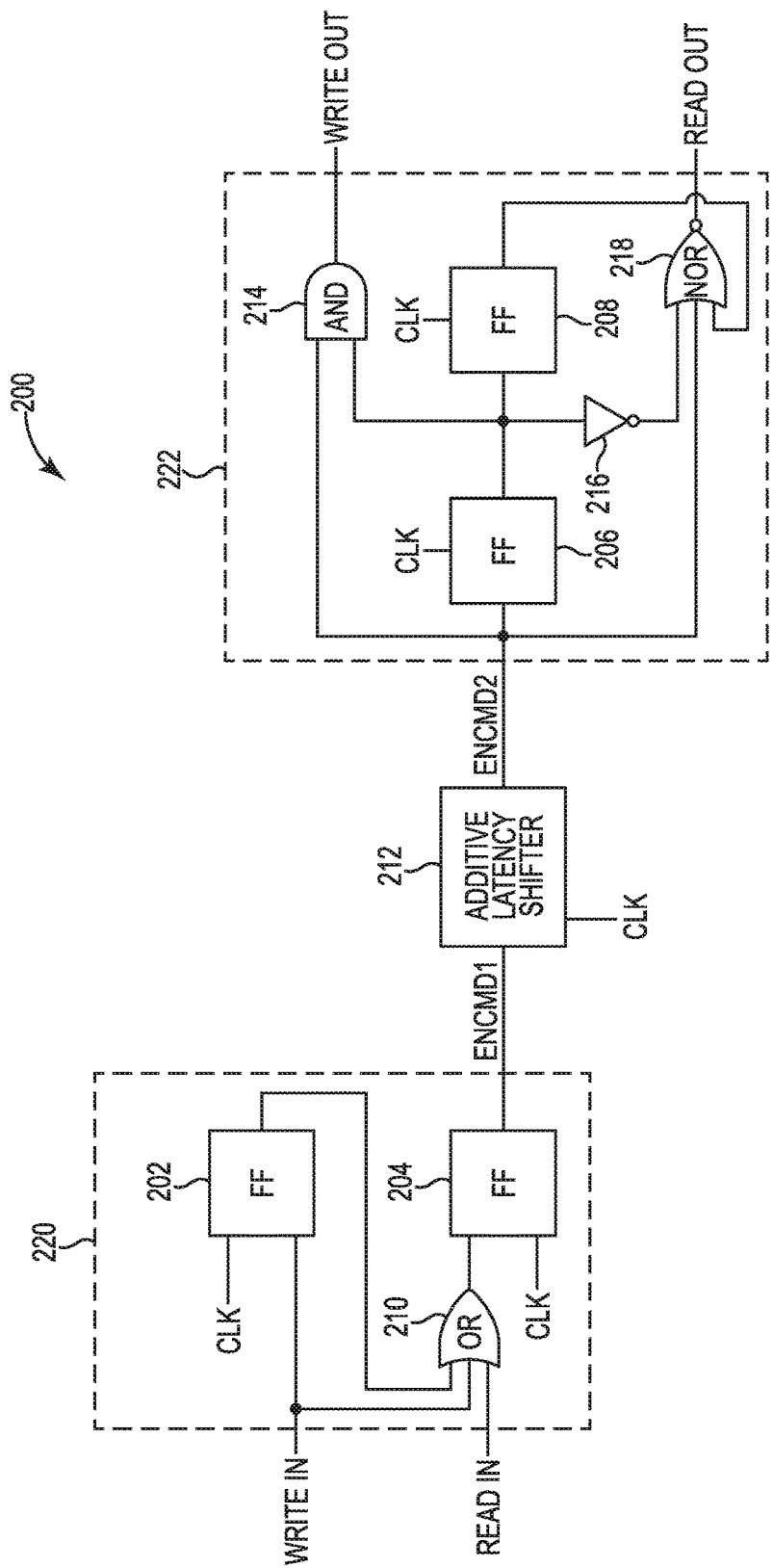
FIG. 2 is a block diagram of a command path in accordance with the present disclosure.

FIG. 2 is a block diagram of a command path 200 in accordance with the present disclosure. The command path 200 may be implemented as the command path 100 of FIG. 1, for example. The command path 200 may receive internal commands from a command decoder, such as the command decoder 102 of FIG. 1 for example, and provide the commands to circuitry configured to perform the commands. The commands may be encoded, propagated, and decoded by the command path 200 before the commands are provided to their corresponding circuitry. The operation of the command path 200 may be based on a clock signal CLK, which may be a system clock or a derivative thereof. The command path 200 may include an encoder circuit 220, an additive latency shifter circuit (ALS) 212, and a decoder circuit 222.

The encoder 220 may include first and second flip flops 202, 204, which may operate based on the clock signal CLK, and an OR gate 210. The OR gate 210 may be a different type of logic gate in some embodiments, such as a NOR gate for example. The encoder 220 may be configured to receive internal commands, from a command decoder for example, and encode the commands based at least in part on the command type, which may then be provided to the ALS 212 for propagation to the decoder 222.

A read command signal READ IN may be received by the encoder 220. The read command, which may be represented by a signal pulse of 1tCK in duration, may be received by the OR gate 210, which may be directly provided to the flip flop 204. At a next clock edge of the CLK signal, a rising clock edge for example, the flip flop 204 may provide the read command at an output. At a subsequent clock edge, the READ IN signal may be low since the read command is 1tCK wide, which may result in the output of the flip flop 204 going low. After the second clock edge, the flip flop 204 may have provided a signal that is at a high logic level for a duration of one cycle of the CLK signal, e.g., a 1tCK pulse. This signal may represent an encoded read command, which may be provided to the ALS 212 as an ENCMD1 signal.

In operation of a write command, a write command signal WRTE IN may be received by the encoder 220. The write command, which may also be represented by a signal pulse of 1tCK in duration, may be received by the flip flop 202 and the OR gate 210. The OR gate 210 may directly provide the write command to the input of the flip flop 204. On a next clock edge of the CLK signal, the write command may be provided on the output of the flip flop 202 and by the output of the flip flop 204. At a subsequent clock edge of the CLK signal, the input of the flip flop 204 may still be at a high logic level due to the output of the flip flop 202 provided by the OR gate 210. As such, the output of the flip flop 204 may remain at the high logic level for a second consecutive clock cycle. At a third clock edge, the output of the flip flop 204 may transition to a low logic level due to a low input. Accordingly, a write command may be encoded to be a signal that is at the high logic level for two clock cycles of the CLK signal, e.g., a 2tCK pulse, which is provided to the ALS 212 as the ENCMD1 signal. Alternatively, the 2tCK pulse may be recognized as two adjacent 1tCK pulses, which may represent a binary "11" signal.

The ALS 212 may be similar to the ALS 106 discussed in regards to FIG. 1, and further description is omitted for sake of brevity. The ALS 212 may receive the encoded command signal ENCMD1 from the encoder 220 and provide the encoded command signal ENCMD2 to the decoder 222 at a time based on a latency of the ALS 212. The latency of the ALS 212 may also provide timing information for performance of the commands.

The decoder 222 may include first and second flip flops 206, 208, an inverter 216, an AND gate 214, and a NOR gate 218. Other gates besides the AND gate and the NOR gate may be implemented in some embodiments. The first and second flip flops 206, 208 may also operate based on the clock signal CLK. The decoder 222 may be configured to receive the encoded commands ENCMD2 from the ALS 212 and decode the encoded commands. The decoded commands may then be provided to the memory based on the command type as respective signals WRITE OUT and READ OUT.

In operation of a read command, an encoded read command may be received at an input of the flip flop 206, an input of the AND gate 214, and at an input of the NOR gate 218. Outputs of the AND gate 214 and the NOR gate 218 may remain at a low logic level. At a first clock edge of the CLK signal, the flip flop 206 may provide at an output a signal at a high logic level. As a result, the input to the flip flop 206 and the inputs to the AND gate 214 and NOR gate 218 received from the ALS 212 may be low, but the input to the flip flop 208, the inverter 216 and the second input of the AND gate 214 may be at a high logic level. The inverter may accordingly provide a low input to the NOR gate 218. Additionally, an output of the flip flop 208 may be at a low logic level. Thus, an output of the AND gate 214 will be low due to having one input high and the other low, and an output of the NOR gate 218 may be at a high logic level since all three inputs are low. Thus, a 1tCK encoded read command is decoded and provided as a READ OUT signal by the decoder 222.

In operation of a write command, an encoded write command, which may be represented by a signal pulse that is 2tCK in duration, may be received by the AND gate 214, the flip flop 206, and the NOR gate 218. At a first clock edge of the CLK signal, the flip flop 206 may provide a signal at a high logic level at an output, which may be provided to the other input of the AND gate 214, the flip flop 208 and the inverter 216. Because the encoded write command is at a high logic level for two clock cycles, the output of the ALS 212 may still be at a high logic level, which is subsequently received by the AND gate 214. Since both inputs of the AND gate 214 are now at a high logic level, the output of the AND gate 214 may transition to a high logic state, which represents a write command. Simultaneously, the NOR gate 218 may receive one high input from the output of the ALS 212 and the other two inputs may be low, which may result in a low output. The decoder 222 may thusly provide the write command as a WRITE OUT signal.

The example embodiment of FIG. 2 illustrates encoding by way of lengthening of the internal command signal pulse width. To implement the disclosed binary encoding, the combination of logic and flip flops in both the encoder 220 and the decoder 240 may be configured to provide the desired sequence of pulses. One skilled in the art would understand the changes required to implement said encoding.

In this light, the command path 200 may receive different commands that are represented by similar signals, encode the commands based on command type, and propagate the commands via a command shifter. The encoded commands may then be received by a decoder, which may decode the commands and provide them to respective outputs for their operation. The above discussion of the encoder 220 and the decoder 222 are considered illustrative of the techniques presented in the present disclosure. There may be many permutations of encoding and decoding the commands, which are included in the limits of this disclosure.

Figure 3:
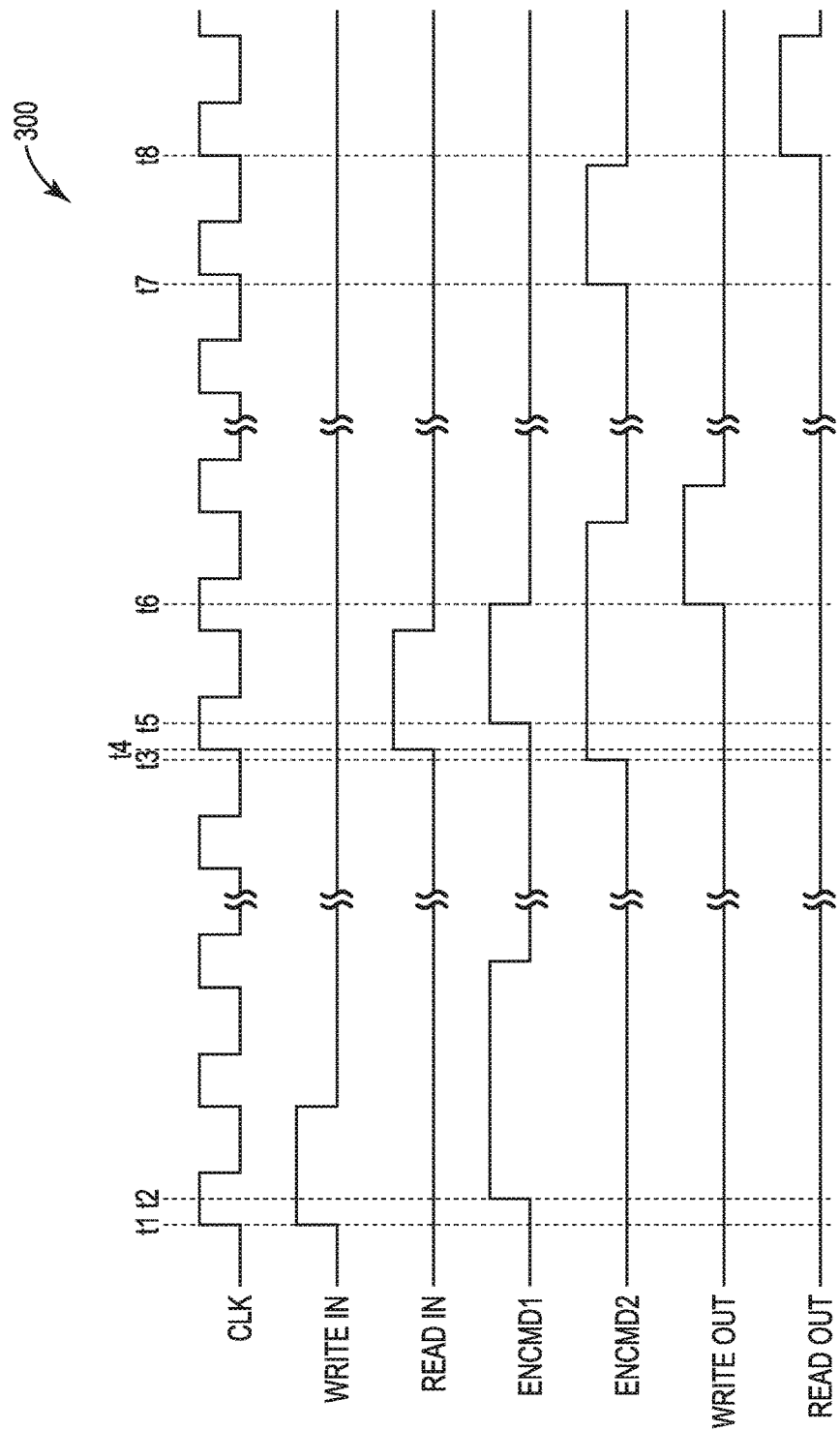
FIG. 3 is an example timing diagram in accordance with the present disclosure.

FIG. 3 is an example timing diagram 300 in accordance with the present disclosure. The timing diagram 300 is an illustration of the relative timing of the encoding, propagation, and decoding of commands discussed above with regards to FIG. 2.

The timing diagram 300 includes the system clock signal CLK, signals WRITE IN and READ IN, encoded command 1 signal ENCMD1, encoded command 2 signal ENCMD2, and output command signals WRITE OUT and READ OUT. The READ IN and WRITE IN signals may be the internal read and write commands provided by a command decoder, for example, which may be encoded by the encoder 220. The ENCMD1 signal may be provided by the encoder 220 to a command shifter, the ALS 212 for example. The ENCMD2 signal may be output from the ALS 212, and provided to the decoder 222. The WRITE OUT and READ OUT signals may be the decoded commands provided by the decoder 222.

At time t1 a WRITE IN signal may be clocked into the encoder 220, and subsequently provided as the ENCMD1 signal at time t2. The encoded write command ENCMD1 signal is depicted as two clock cycles wide, e.g., as encoded from one clock cycle in width to two clock cycles in width. Between times t2 and t3, the encoded write command propagates through the ALS 212. The ENCMD2 signal is provided by the ALS 212 to the decoder 222. At time t4 a READ IN signal may be clocked into the encoder 220 and subsequently provided as the second ENCMD1 signal at time t5 to the encoder 220. At time t6, the decoded write command is provided as the WRITE OUT signal by the decoder 222. Between times t5 and t7, the encoded read command propagates through the ALS 212 and may then be provided to the decoder 222. At time t8, the decoded read command is provided as the READ OUT signal.

Figure 4A:
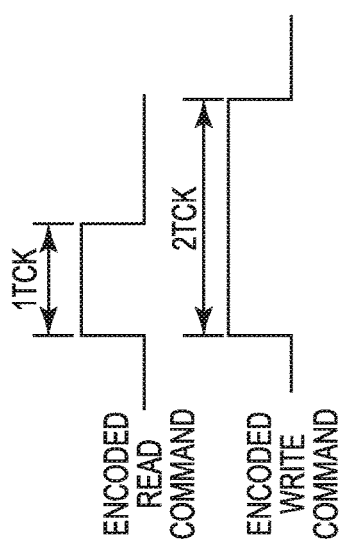
FIGS. 4A and 4B depict example encoded command signals in accordance with the present disclosure.
Figure 4B:
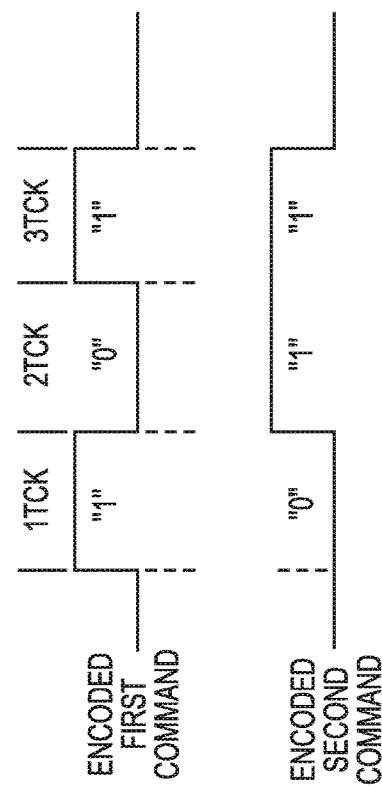

FIGS. 4A and 4B depict example encoded command signals in accordance with the present disclosure. FIG. 4A depicts example encoded read and write commands. As discussed above, both the read and write command prior to encoding may conventionally be represented by a single 1tCK pulse. Post encoding, as shown in FIG. 4A, an encoded read command may be represented by a 1tCK pulse whereas a write command may be represented by a 2tCK pulse. While the encoded write command may be represented by a 2tCK pulse and the read command represented by a 1tCK pulse, embodiments discussed herein may perform the opposite, such that a read would be represented by a 2tCK pulse and the write represented by a 1tCK pulse. FIG. 4B depicts two different commands represented by binary encoded signals. The example encoded binary sequences may be used to encode any memory command and the example signals are not limiting. The encoded first command may be represented by "101," where each bit of the encoded command is 1tCK wide. The encoded second command is depicted by the binary sequence of "110," which may be encoded as a MS write command, for example. Here, a "1" is represented by a 1tCK pulse of a high logic level while a "0" is represented by a low logic value for 1tCK in duration. In some embodiments, a "1" may be represented by the low logic level and the "0" may be represented by the high logic level.

Figure 5:
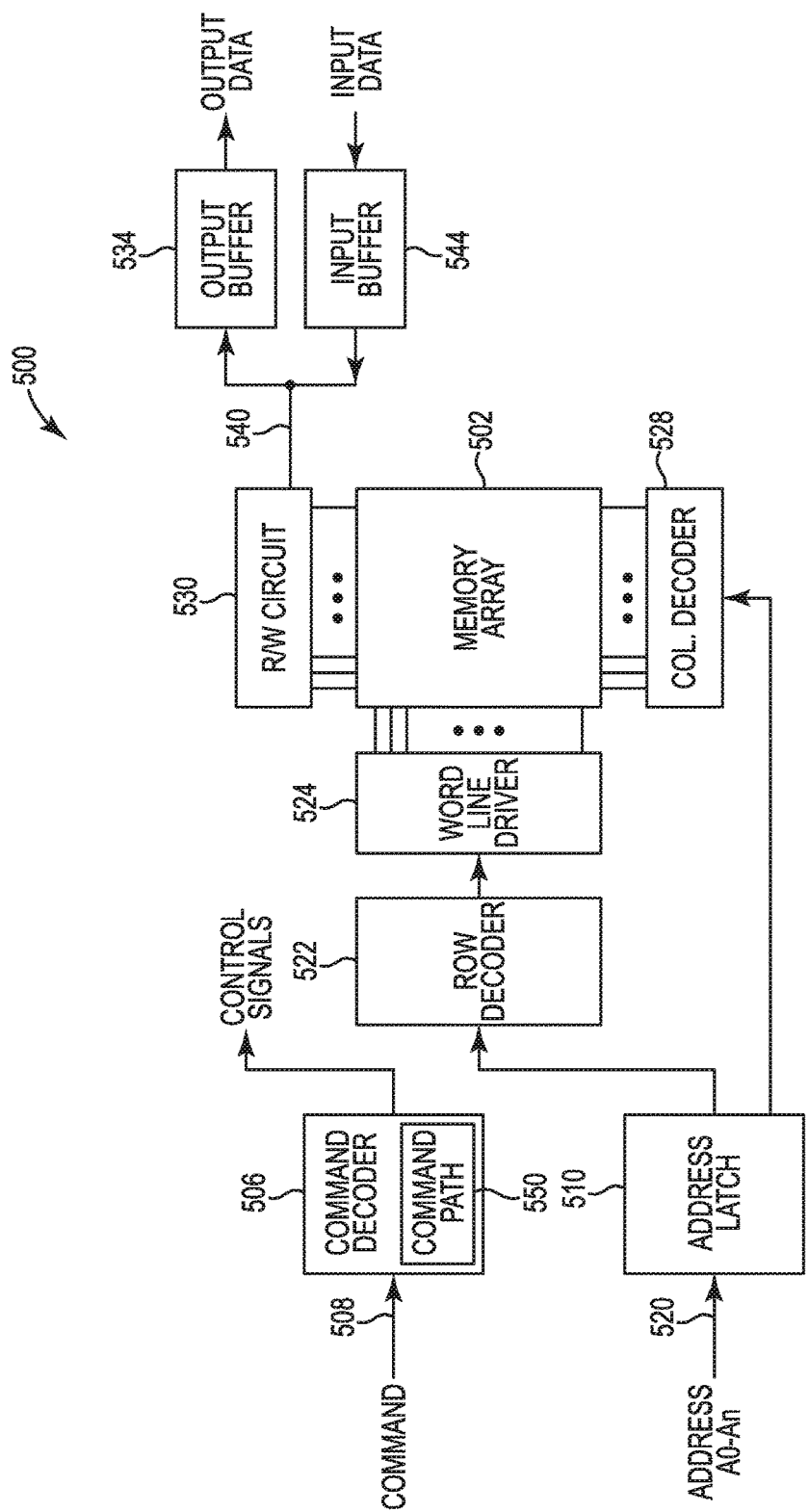
FIG. 5 is an example memory in accordance with the present disclosure.

FIG. 5 illustrates a memory 500 according to an embodiment as discussed herein. The memory 500 includes an array 502 of memory cells, which may be, for example, volatile memory cells (e.g., DRAM memory cells, SRAM memory cells), non-volatile memory cells (e.g., flash memory cells), or some other types of memory cells. The memory system 500 includes a command decoder 506 that receives memory commands through a command bus 508 and generates corresponding control signals within the memory system 500 to carry out various memory operations. The command decoder 506 responds to memory commands applied to the command bus 508 to perform various operations on the memory array 502. For example, the command decoder 506 is used to generate internal control signals to read data from and write data to the memory array 502. Row and column address signals are applied to the memory system 500 through an address bus 520 and provided to an address latch 510. The address latch then outputs a separate column address and a separate row address.

The row and column addresses are provided by the address latch 510 to a row address decoder 522 and a column address decoder 528, respectively. The column address decoder 528 selects bit lines extending through the array 502 corresponding to respective column addresses. The row address decoder 522 is connected to word line driver 524 that activates respective rows of memory cells in the array 502 corresponding to received row addresses. The selected data line (e.g., a bit line or bit lines) corresponding to a received column address are coupled to a read/write circuitry 530 to provide read data to a data output buffer 534 via an input-output data bus 540. Write data are applied to the memory array 502 through a data input buffer 544 and the memory array read/write circuitry 530.

The command decoder may include a command path 550, which may be configured to encode internal commands and provide them to an additive latency shifter, for example. At an output of the additive latency shifter, a decoder may receive the commands, decode them, and provide them to their respective circuitry. The encoding and decoding of the commands may allow fewer additive latency shifters to be included in the memory 500. For example, additive latency shifters for each command type may be replaced by a single additive latency shifter when commands are encoded prior to propagation through the additive latency shifter.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:

1. An apparatus, comprising:
an encoder circuit configured to encode a command and provide an encoded command and a preceding code indicative of the encoded command, the preceding code indicative of the encoded command in clock cycles between the encoded command and another encoded command; and
a decoder circuit configured to decode at least the encoded command and to provide a decoded command indicative of the command, wherein the clock cycles between the encoded command and the another encoded command comprise a minimum number of clock cycles available between the command and the another encoded command, and wherein the minimum number of clock cycles available is associated with a number of intervening clock cycles between a leading edge of the command and a leading edge of the another command.

2. The apparatus of claim 1, wherein the preceding code indicative of the encoded command in clock cycles between the encoded command and the another encoded command corresponds to a high or low logic level of a bit.

3. The apparatus of claim 1, wherein the encoder circuit is configured to encode the command in accordance with a binary value.

4. The apparatus of claim 3, wherein the binary value is represented in the intervening clock cycles.

5. The apparatus of claim 3, wherein the encoder circuit is further configured to transform a pulse width of the command to represent the binary value indicative of the command type.

6. The apparatus of claim 1, further comprising:
a latency circuit coupled to the encoder and configured to provide a latency to the encoded command.

7. An apparatus comprising:
an encoder circuit configured to encode a command and provide an encoded command and a preceding code indicative of the encoded command, the preceding code indicative of the encoded command in clock cycles between the encoded command and another encoded command, wherein the encoder circuit is configured to encode the command in accordance with a binary value, and wherein the encoder circuit is further configured to transform a pulse width of the command to represent the binary value indicative of the command type; and
a decoder circuit configured to decode at least the encoded command and to provide a decoded command indicative of the command, wherein the pulse width of the command is transformed to a pulse width of the encoded command, the pulse width of the encoded command based on a number of intervening clock cycles between a leading edge of the command and a leading edge of the another encoded command.

8. A method, comprising:
encoding a command based on command type to generate an encoded command;
decoding the encoded command to generate a decoded command associated with the command type; and
providing the decoded command to perform a memory operation corresponding to the command type, wherein a number of clock cycles between the command and another command indicates the number of command types to be encoded.

9. The method of claim 8, wherein encoding commands based on command type comprises transforming a pulse width of the command to represent a binary value indicative of the command type.

10. A method comprising:
encoding a command based on command type to generate an encoded command;
decoding the encoded command to generate a decoded command associated with the command type; and
providing the decoded command to perform a memory operation corresponding to the command type, wherein decoding the encoded command to generate the decoded command associated with the command type comprises:
determining a duration of the encoded command relative to a duration of a clock cycle of a clock signal; and
determining a command type of the encoded command based on the duration of the encoded command relative to the duration of the clock cycle of the clock signal.

* * * * *